United States Patent [19]

Picciotto

[11] Patent Number: 5,699,004
[45] Date of Patent: Dec. 16, 1997

[54] TEMPERATURE COMPENSATION OF LOGARITHMIC AMPLIFIERS IN A SAMPLED DATA SYSTEM

[75] Inventor: Carl E. Picciotto, Palo Alto, Calif.

[73] Assignee: Hewlett-Packard Company, Palo Alto, Calif.

[21] Appl. No.: 642,008

[22] Filed: May 1, 1996

[51] Int. Cl.[6] .................. H03G 11/08; H01L 35/00
[52] U.S. Cl. ............................... 327/350; 327/513
[58] Field of Search .................... 327/350, 351, 327/352, 346, 512, 513

[56] References Cited

U.S. PATENT DOCUMENTS

| | | | |
|---|---|---|---|
| 3,569,736 | 3/1971 | Tschinkel | 327/350 |
| 3,624,409 | 11/1971 | Folsom et al. | 327/350 |
| 4,529,966 | 7/1985 | Burroughs | 340/347 CC |
| 4,786,970 | 11/1988 | Moore | 327/350 |
| 5,327,029 | 7/1994 | Ericson et al. | 327/350 |

*Primary Examiner*—Toan Tran

[57] ABSTRACT

Compensation is provided for temperature-effects intrinsic to a logging transistor in a logarithmic amplifier by applying a temperature-dependent term to a voltage reference of an analog-to-digital converter.

12 Claims, 3 Drawing Sheets

1

TEMPERATURE COMPENSATION OF LOGARITHMIC AMPLIFIERS IN A SAMPLED DATA SYSTEM

BACKGROUND OF THE INVENTION

1. Technical Field

The invention relates to logarithmic amplifiers. More particularly, the invention relates to temperature compensation of logarithmic amplifiers in a sampled data system.

2. Description of the Prior Art

Logarithmic amplifiers provide a relatively inexpensive way to acquire high-dynamic range signals at a reasonably fast rate, where the required resolution may be expressed in a relative sense. That is, the minimum required resolution may be given as a percentage of the signal level, and not as a fixed absolute, so that the absolute resolution may be allowed to decrease with larger signals. This is the case with such applications as mass spectrometry.

Logarithmic amplifiers are based on the exponential relationship between the base-emitter voltage and collector current of bipolar transistors. In a logarithmic amplifier, the familiar exponential current-to-voltage relationship:

$$I_C = I_S e^{\frac{V_{be}}{nV_T}} \quad (1)$$

is used in reverse, as:

$$V_{be} = nV_T \ln\left(\frac{I_c}{I_s}\right) = nV_T[\ln(I_c) - \ln(I_s)]. \quad (2)$$

A current is applied to the collector, and the compliant base-emitter voltage is sensed.

FIG. 1 is a simple block diagram of a generic logarithmic amplifier that includes an operational amplifier 10 and a logging transistor 12. The transfer function of the amplifier follows (2) above, where Ic and Is are, respectively, the collector current and saturation current of the transistor 12. Unfortunately, in such circuit the saturation current term $I_s$ is dependent upon temperature. Also, the thermal voltage $V_T$ is directly proportional to temperature, given in degrees Kelvin. It is therefore necessary to compensate for these two temperature-dependent terms.

Compensating for $I_s$ is relatively straightforward. A second transistor 14, through which a constant current $I_{C2}$ is applied, is generally placed in series with the logging transistor 12, such that the two base-emitter voltages subtract. See FIG. 2. Assuming the saturation currents of the two transistors are matched, then:

$$\begin{aligned} V_{log} &= nV_T[\ln(I_{c1}) - \ln(I_s)] - nV_T[\ln(I_{c2}) - \ln(I_s)] \\ &= nV_T\left[\ln\left(\frac{I_{c1}}{I_{c2}}\right)\right] \end{aligned} \quad (3)$$

Notice that the $I_s$ term is gone.

It is next necessary to compensate for the thermal voltage $V_T$ in Equation (3) above. Most commonly, this compensation is accomplished by using a carefully-selected temperature-sensitive resistor. If the resistance appears as a denominator in a gain stage, the variations of $V_T$ can be canceled out.

Such is the case with FIG. 3, illustrating the block diagram of a logarithmic amplifier that uses a temperature-sensitive resistor 19 to compensate for the thermal voltage. The resistor $R_T$ must vary directly with Kelvin temperature if it is to cancel out $V_T$ in Equation (3) above. If one considers 25° Celsius as a nominal temperature, then $R_T$ must have a $T_c$ of 1/298 part per degree C., or 3356 ppm/degC.

One major disadvantage of the foregoing temperature compensation scheme is the difficulty of sourcing a precision temperature-sensitive resistor that exhibits a consistently accurate $T_c$.

It is nonetheless desirable to take the expression in Equation (3) above and cancel the temperature effects of $V_T$ by dividing the expression by a term directly proportional to the Kelvin temperature. Assuming such a term were available, it is not readily apparent how to divide one voltage by another, while retaining the original dynamic range. One approach to performing such division requires the use of an expensive analog division circuit.

It would be advantageous to provide a technique for effecting temperature compensation in a logarithmic amplifier that does not require the use of a precision temperature-sensitive resistor or an expensive analog division circuit.

SUMMARY OF THE INVENTION

The invention provides a logarithmic amplifier that incorporates an analog-to-digital converter (ADC). The invention is based upon the discovery that multiplying an ADC's voltage reference by a compensation factor has the same effect as dividing the input voltage by that same factor. The system herein disclosed thus includes a scheme for varying the ADC's reference voltage directly with Kelvin temperature, thus compensating for the thermal voltage $V_T$. The circuit that generates this reference voltage is akin to a logarithmic amplifier with a constant input current, which has been compensated for the temperature variations of the logging transistor's saturation current, but not of its thermal voltage. In other words, the circuit is comparable to the circuit depicted on FIG. 2, except with a constant input current. This arrangement provides a voltage that is directly proportional to $V_T$.

DETAILED DESCRIPTION OF THE INVENTION

Figure 1:
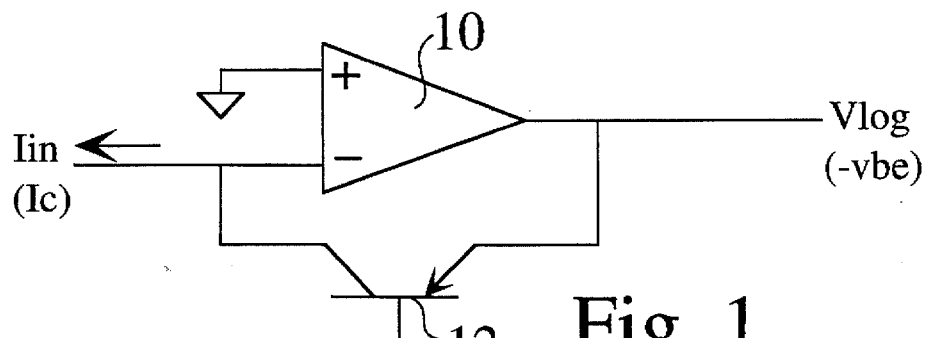
FIG. 1 is a block diagram of a generic logarithmic amplifier.
Figure 2:
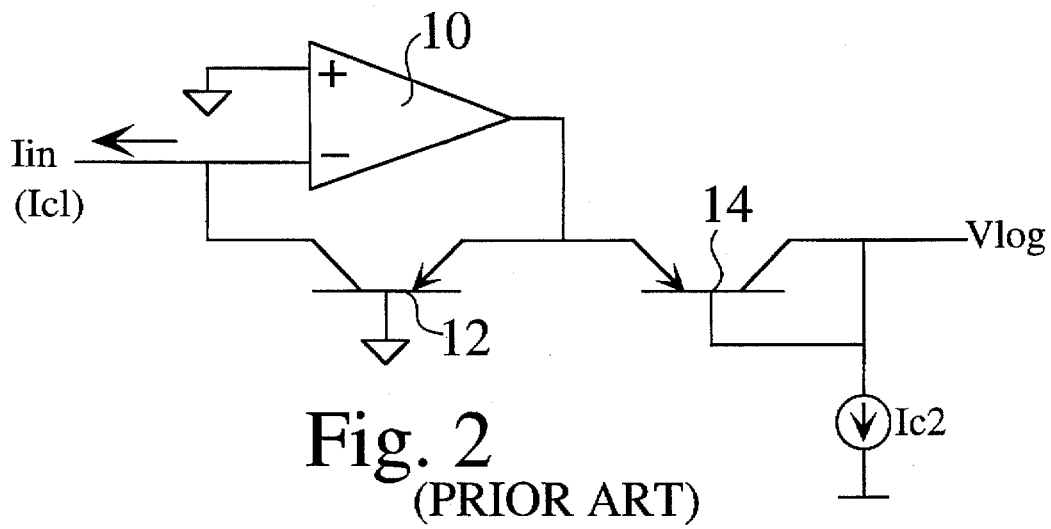
FIG. 2 which is a block diagram of a logarithmic amplifier that incorporates saturation current compensation.
Figure 3:
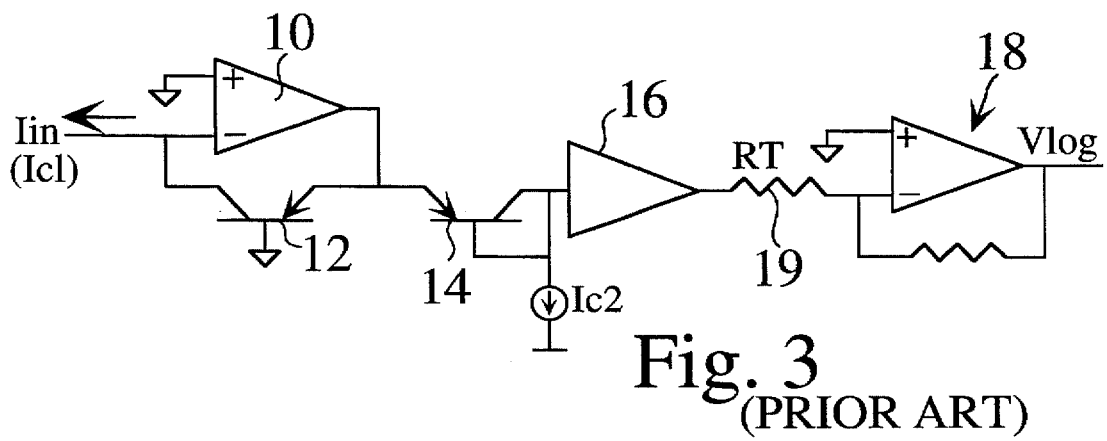
FIG. 3 is a block diagram of a logarithmic amplifier that incorporates a prior art thermal voltage compensation scheme.
Figure 4:
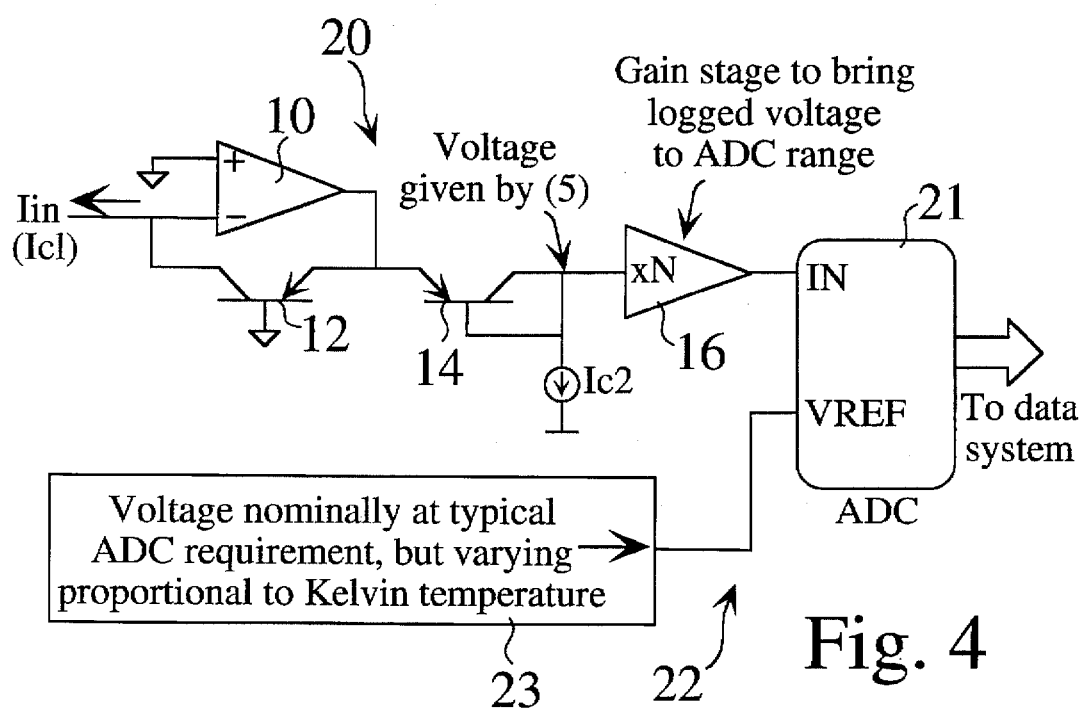
FIG. 4 is a block diagram of a logarithmic amplifier that incorporates a thermal compensation scheme which comprises an analog-to-digital converter according to the invention.

FIG. 4 is a block diagram of a logarithmic amplifier that incorporates a thermal compensation scheme according to the invention. The logarithmic amplifier provides a first path 20 that comprises a signal channel and a second path 22 that represents a reference voltage that varies directly proportional to Kelvin temperature. The invention includes an analog-to-digital converter (ADC) 21 and means 23 for adjusting the ADC reference voltage to compensate for temperature variations.

As discussed above, traditional temperature compensation methods involve the use of temperature-sensitive resistors. The invention herein disclosed is thought to yield more accurate and more repeatable temperature compensation, thereby resulting in a higher confidence in the linearity of the logarithmic amplifier.

Figure 5:
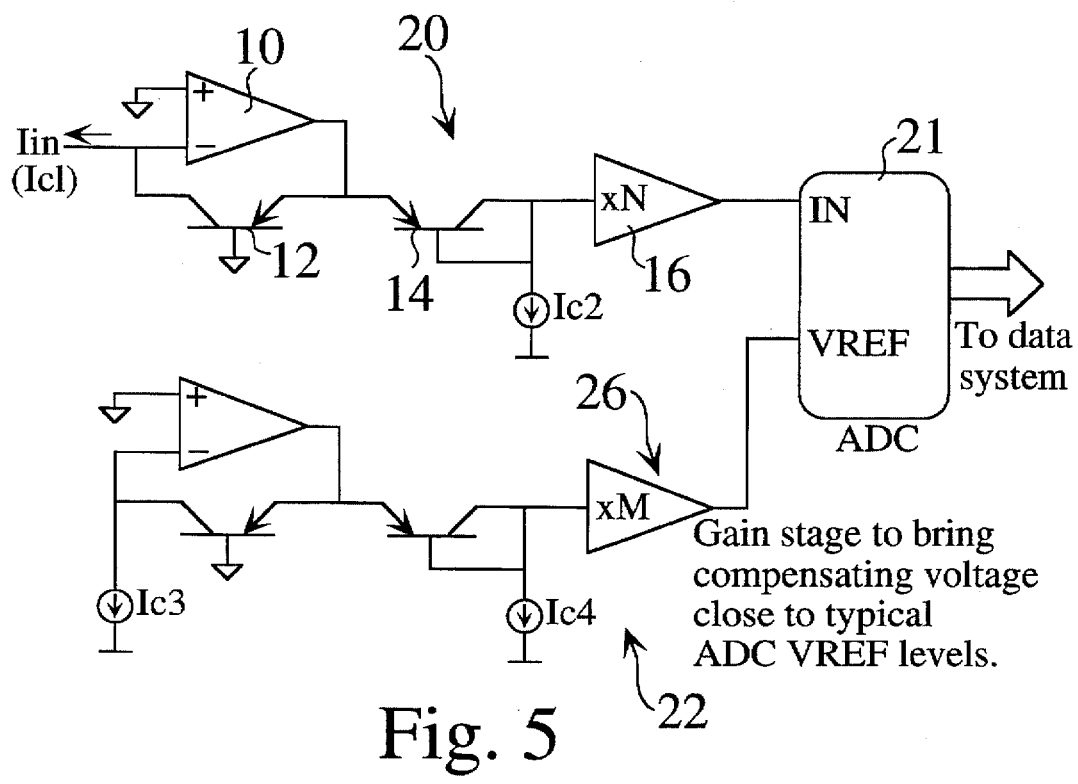
FIG. 5 is a block diagram of the logarithmic amplifier of FIG. 4, further comprising a gain stage that provides a compensating voltage which is close to typical analog-to-digital converter VREF levels according to the invention.

FIG. 5 is a block diagram of the logarithmic amplifier of FIG. 4, further comprising a gain stage 26 that provides a compensating voltage which is close to typical analog-to-digital converter VREF levels according to the invention. The system herein disclosed thus includes a circuit that is analogous to an additional logarithmic amplifier with a constant input current, that has been compensated for the temperature variations of the logging transistor's saturation current, but not of its thermal voltage. This arrangement provides a voltage that is directly proportional to $V_T$.

Figure 6:
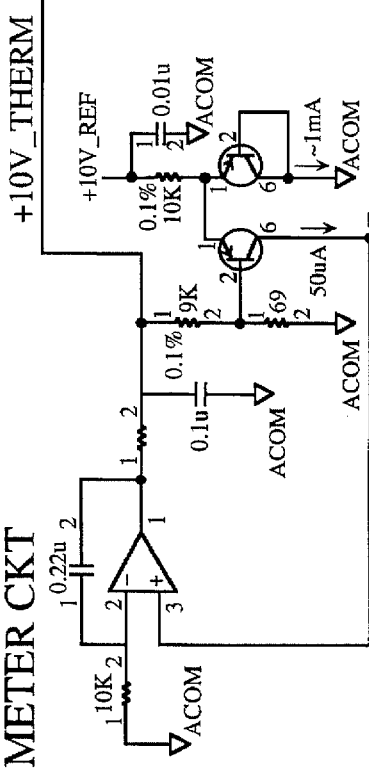
FIG. 6 is a schematic diagram of a portion of a logarithmic amplifier that incorporates a thermal compensation scheme in accordance with a preferred embodiment of the invention.
Figure 6:
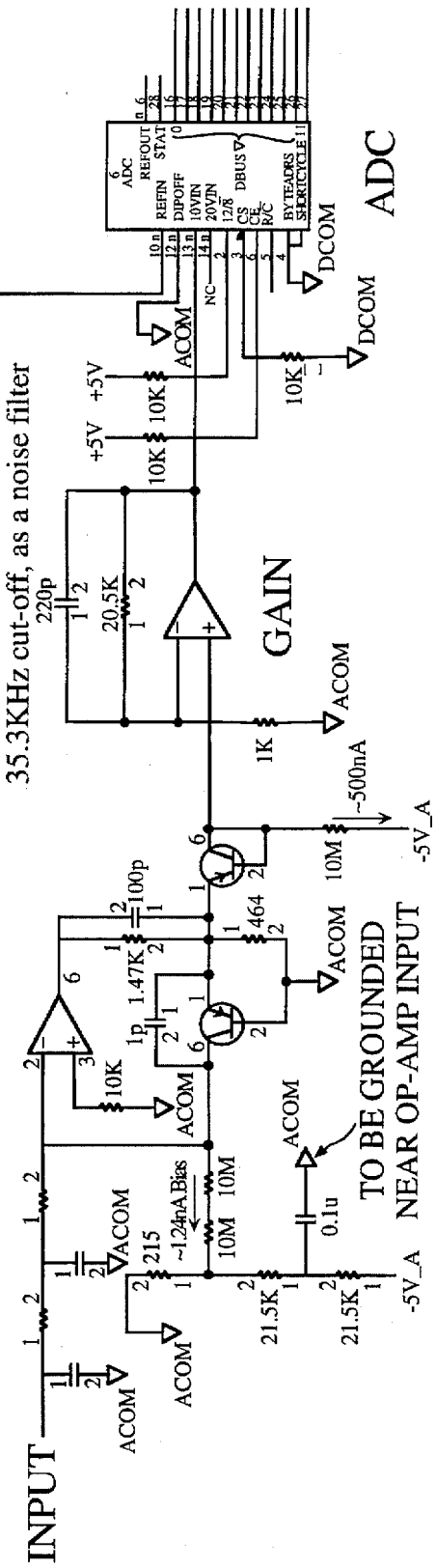

FIG. 6 shows that actual implementation of the reference circuit 23, under the heading "THERMOMETER CKT." The circuit directs constant currents through the two PNP transistors, subtracts the two emitter-base voltages, and then magnifies the difference by a factor of about 130, thus generating the nominally +10V reference. The result is a voltage raised to the levels required by the ADC reference input, and which varies directly with Kelvin temperature. As stated above, the circuit is analogous to a constant-input logarithmic amplifier. The configuration was altered to realize a gain stage without necessitating an additional operational amplifier.

Although the invention is described herein with reference to the preferred embodiment, one skilled in the art will readily appreciate that other applications may be substituted for those set forth herein without departing from the spirit and scope of the invention. Such scope is deemed to extend to include any temperature-compensation scheme which, through the use of a thermally-varying voltage to realize a division function, departs from the prior art technique of adjusting amplifier gains using temperature-sensitive resistors. In addition to the implementation outlined herein, division by a thermally-varying voltage may be accomplished, for example, by analog division circuits, or by microcontrollers that quantize the thermally-varying voltage and perform mathematical division. Accordingly, the invention should only be limited by the claims included below.

I claim:

1. A logarithmic amplifier, comprising:

a first logging-circuit that provides a signal-dependent voltage;

a path that provides a reference voltage that varies directly proportional to Kelvin temperature the path including a second logging circuit; and a dividing means, connected to the logging circuit and the path, for dividing the signal-dependent voltage by the reference voltage.

2. The logarithmic amplifier of claim 1, said second logging circuit further comprising:

a first logarithmic amplifier having a constant input current and which has been compensated for temperature variation of saturation current of a logging transistor of said first logarithmic amplifier, but not for thermal voltage of said transistor, wherein said first logarithmic amplifier provides the reference voltage.

3. The logarithmic amplifier of claim 1, said first logging circuit further comprising:

an operational amplifier; and a logging transistor.

4. The logarithmic amplifier of claim 3, further comprising:

a second transistor placed in series with said logging transistor, such that a base-emitter voltage of the second transistor is subtracted from a base-emitter voltage of said logging transistor.

5. The logarithmic amplifier of claim 1, the dividing means comprising:

an analog-to-digital converter (ADC) with a signal input connected to the first logging circuit and a voltage reference (VREF) input connected to the path.

6. The logarithmic amplifier of claim 1, the dividing means comprising:

an analog-to-digital converter (ADC) with a signal input and a voltage reference (VREF) input; and one of a first gain stage and a second gain stage, the first gain stage connected to the signal input and the first logging circuit, providing an amplified signal-dependent voltage to the signal input, the second gain stage connected to the VREF input and the path, providing an amplified reference voltage to the VREF input.

7. A method of compensating a logarithmic amplifier for variations in ambient temperature, the method comprising:

varying a reference voltage output from a second logging circuit in direct proportion to ambient temperature; and dividing an output signal voltage from the logarithmic amplifier by the reference voltage output from the second logging circuit.

8. The method of claim 7, wherein the step of varying a reference voltage output from the second logging circuit further comprises:

providing an input signal voltage at a predetermined level to the second logging circuit; and compensating for temperature dependent saturation current in the second logging circuit.

9. The method of claim 7, further comprising:

processing an input signal voltage of the logarithmic amplifier through an operational amplifier and a logging transistor to determine an output signal voltage of the logarithmic amplifier.

10. The method of claim 9, further comprising:

subtracting the base-emitter voltage of a second transistor from the base-emitter voltage of the logging transistor.

11. The method of claim 7, wherein the step of dividing an output signal voltage from the logarithmic amplifier by the reference voltage output from the second logging circuit further comprises:

processing the output signal voltage from the logarithmic amplifier and the reference voltage output from the second logging circuit through an analog-to-digital converter (ADC).

12. The method of claim 11, further comprising:

amplifying one of the reference voltage output from the second logging circuit and the output signal voltage from the logarithmic amplifier to a level within an operating range of the ADC.

* * * * *